（12） United States Patent
Zäch et al.

(10) Patent No.: US 11,209,353 B2
(45) Date of Patent: Dec. 28, 2021

(54) INFRARED DEVICE

(71) Applicant: SENSIRION AG, Stäfa (CH)

(72) Inventors: Nicolas Zäch, Stäfa (CH); Martin Winger, Stäfa (CH); Nicolas Daix, Stäfa (CH); Sebastian Raab, Stäfa (CH); Thomas Uehlinger, Stäfa (CH)

(73) Assignee: SENSIRION AG, Stäfa (CH)

( * ) Notice: Subject to any disclaimer, the term of this patent is extended or adjusted under 35 U.S.C. 154(b) by 0 days.

(21) Appl. No.: 16/651,230

(22) PCT Filed: Sep. 28, 2018

(86) PCT No.: PCT/EP2018/076509
§ 371 (c)(1),
(2) Date: Mar. 26, 2020

(87) PCT Pub. No.: WO2019/063814
PCT Pub. Date: Apr. 4, 2019

(65) Prior Publication Data
US 2020/0232913 A1 Jul. 23, 2020

(30) Foreign Application Priority Data
Sep. 28, 2017 (EP) .................................... 17193760

(51) Int. Cl.
*G01N 21/35* (2014.01)
*G01N 21/3504* (2014.01)
*G01J 3/10* (2006.01)
*G01J 5/08* (2006.01)

(52) U.S. Cl.
CPC .......... *G01N 21/3504* (2013.01); *G01J 3/108* (2013.01); *G01J 5/0853* (2013.01)

(58) Field of Classification Search
CPC ..... G01N 21/3504; G01J 3/108; G01J 5/0853
See application file for complete search history.

(56) References Cited

U.S. PATENT DOCUMENTS

| 8,618,481 | B2 | 12/2013 | Babak |
| 9,006,857 | B1 | 4/2015 | Carr |
| 2003/0060034 | A1 | 3/2003 | Beyne et al. |
| 2006/0113622 | A1 | 6/2006 | Adkisson et al. |

(Continued)

FOREIGN PATENT DOCUMENTS

| EP | 2732253 B1 | 7/2015 |
| EP | 3315929 A1 | 5/2018 |

(Continued)

OTHER PUBLICATIONS

International Search Report and Written Opinion dated Dec. 10, 2018, PCT Patent Application No. PCT/EP2018/076509, filed Sep. 28, 2018, European Patent Office, 13 pages.

(Continued)

*Primary Examiner* — Hugh Maupin
(74) *Attorney, Agent, or Firm* — Mannava & Kang, P.C.

(57) ABSTRACT

An infrared device comprises a substrate. A configuration for emitting infrared radiation is supported by the substrate. The configuration comprises an electrically conducting layer arrangement of less than 50 nm thickness between dielectric layers. In addition, a heater arranged for heating the configuration to emit the infrared radiation is supported by the substrate.

20 Claims, 5 Drawing Sheets

(56) References Cited

U.S. PATENT DOCUMENTS

| | | |
|---|---|---|
| 2007/0048180 A1 | 3/2007 | Gabriel et al. |
| 2007/0171120 A1 | 7/2007 | Puscasu et al. |
| 2008/0135758 A1 | 6/2008 | Yang et al. |
| 2008/0220535 A1 | 9/2008 | Leboeuf et al. |
| 2009/0207226 A1 | 8/2009 | Ikeda et al. |
| 2010/0213373 A1 | 8/2010 | Meinel et al. |
| 2010/0213374 A1 | 8/2010 | Meinel et al. |
| 2012/0235067 A1 | 9/2012 | Araci et al. |
| 2012/0298867 A1 | 11/2012 | Nishikawa et al. |
| 2012/0322164 A1 | 12/2012 | Lal et al. |
| 2013/0186178 A1 | 7/2013 | Usagawa |
| 2014/0111844 A1 | 4/2014 | Puscasu et al. |
| 2014/0131577 A1 | 5/2014 | Meinel et al. |
| 2014/0175585 A1 | 6/2014 | Iguchi |
| 2014/0260546 A1 | 9/2014 | Chen et al. |
| 2014/0291704 A1 | 10/2014 | Ali et al. |
| 2014/0319350 A1 | 10/2014 | Yon et al. |
| 2015/0033827 A1 | 2/2015 | Burgi et al. |
| 2015/0276489 A1 | 10/2015 | Cumming et al. |
| 2015/0316472 A1* | 11/2015 | Yon ................. G08B 21/16 356/437 |
| 2016/0091371 A1 | 3/2016 | Palanchoke et al. |
| 2017/0363589 A1 | 12/2017 | Kumar et al. |
| 2018/0374981 A1* | 12/2018 | Carr ................. H05B 3/009 |
| 2019/0360924 A1* | 11/2019 | Macrelli ................. H01L 35/34 |

FOREIGN PATENT DOCUMENTS

| | | |
|---|---|---|
| WO | 2014020797 A1 | 2/2014 |
| WO | 2014037622 A1 | 3/2014 |
| WO | 2014062807 A1 | 4/2014 |
| WO | 2017088071 A1 | 6/2017 |

OTHER PUBLICATIONS

Dehui Xu, et al. "MEMS-based thermoelectric infrared sensors: A review", frontiers of mechanical engineering, higher education press, Heidelberg, vol. 12, No. 4, Jun. 14, 2017, pp. 557-566.

Hongwei Qu, "CMOS MEMS Fabrication Technologies and Devices", micromachines, vol. 7, No. 12, Jan. 21, 2016, 21 pages.

T. Akin, "CMOS-based Thermal Sensors", in "Journal of microelectromechanical systems", Feb. 29, 2008, pp. 479-512.

H.T. Miyazaki et al., Chemphyschem Articles, "Dual-band Infrared Metasurface Thermal Emitter for Co2 Sensing", Applied Physics Letters AIP Publishing LLC, vol. 105, No. 12, Sep. 22, 2014, 4 pages.

Kai Chen et al., "Dual-Band Perfect Absorber for Multispectral Plasmon-Enhanced Infrared Sepctroscopy", ACS Nano, vol. 6, No. 9, Sep. 25, 2012, pp. 7998-8006.

Katsuya Masuno et al., "Multiwavelength Selective IR Emission Using Surface Plasmon Polaritons for Gas Sensing" IEE Photonics Technology Letters, vol. 23, No. 22, Nov. 1, 2011, pp. 1661-1663.

* cited by examiner

INFRARED DEVICE

CLAIM FOR PRIORITY

The present application is a national stage filing under 35 U.S.C 371 of PCT application No. PCT/EP2018/076509, having an international filing date of Sep. 28, 2018, which claims priority to European patent application No. 17193760.0 having a filing date of Sep. 28, 2017, the disclosures of which are hereby incorporated by reference in their entireties.

TECHNICAL FIELD

The present invention relates to an infrared device, and to a method for manufacturing an infrared device.

BACKGROUND ART

Conventional gas sensors based on infrared radiation are big in size and hence not suited for integration into mobile electronics, for example. Hence, it is desired to provide a small-scale infrared device that can inter alia be used in gas sensing applications.

DISCLOSURE OF THE INVENTION

According to an aspect of the present invention, an infrared device is provided comprising a substrate. A configuration is supported by the substrate, i.e. arranged on or in the substrate. The configuration is adapted to emit infrared radiation.

According to another aspect of the present invention, an infrared device is provided comprising a substrate. A configuration is supported by the substrate, i.e. arranged on or in the substrate. The configuration is adapted to absorb infrared radiation.

For this purpose, the configuration includes an electrically conducting layer arrangement of less than 50 nm thickness. The electrically conducting layer arrangement is arranged between dielectric layers.

The electrically conducting layer arrangement may include one or more electrically conducting layers, while a thickness of the entire arrangement is limited to 50 nm or less. In a preferred embodiment, the thickness of the electrically conducting layer arrangement is less than 40 nm, in a different embodiment it is less than 30 nm, and in a further embodiment, it is less than 20 nm.

The formation of the electrically conducting layer arrangement between dielectric layers preferably is such that the electrically conducting layer arrangement is sandwiched between the dielectric layers, i.e. is in direct contact with the dielectric layers. Accordingly, it is preferred that on top of an upper layer of the electrically conducting layer arrangement a dielectric layer is provided and is in contact with, while underneath a bottom layer of the electrically conducting layer arrangement another dielectric layer is provided and is in contact with. In case the electrically conducting layer arrangement consists only of a single layer, the dielectric layers are in touch with a top surface and a bottom surface thereof.

In case of the infrared device representing an infrared detector, incident infrared radiation is absorbed by the configuration including the electrically conducting layer arrangement, which preferably contributes significantly to the absorption. A temperature increase resulting from the absorbed infrared radiation is sensed by a thermal sensor of the device.

In case of the infrared device representing an infrared emitter, heat generated by a heater of the device evokes the configuration including the electrically conducting layer arrangement to emit infrared radiation.

It is assumed, that, in case of an infrared detector, incident infrared radiation leads to a standing wave in the configuration, and in particular to a standing wave between outer surfaces of the configuration. The electrically conducting layer arrangement is of a thickness that enhances absorption given that for layer arrangements with a larger thickness, reflection can be assumed rather than absorption. While the material of the electrically conducting layer arrangement can be considered as a broadband infrared absorber, the thickness of the layer arrangement, its vertical arrangement in the configuration, and preferably a thickness of the configuration and/or a thickness of the dielectric layer on top of the electrically conducting layer arrangement may have impact on a dedicated wavelength range/band the detector is more sensitive to than to other wavelength ranges: Accordingly, while the configuration may be exposed to broad band infrared radiation, preferably only the infrared radiation in the defined band may be absorbed and converted into heat measured by the thermal sensor. In case the configuration is heated by a heater, the configuration preferably only emits infrared radiation in the defined band.

In a preferred application, it may be desired to detect and quantify infrared radiation of a given wavelength band only, which is supported by the configuration promoting selective absorption of infrared radiation, i.e. mainly in the defined wavelength band but close to zero absorption outside the defined wavelength band, at least outside the band in the infrared spectrum. Such band limited infrared absorption may serve as a basis for e.g. determining the presence of a gas compound in the environment of the device which gas compound e.g. may specifically absorb infrared radiation in the subject band. The band may be as narrow as to contain a single wavelength only, but in practice may rather encompass a wavelength range, preferably a wavelength range around a center frequency of interest, preferably representing a phase of a periodic modulation. The defined wavelength band may be smaller than broadband, and preferably is less than 1 micrometer, and preferably less than 0.5 micrometer. The center wavelength in one embodiment may be 4.3 micrometers, for which an absorption spectrum of $CO_2$ has a peak. In this respect, and in particular in case of a detector, the configuration may act as a filter for filtering the infrared frequencies of the subject band out of a broader band. In case of an emitter, the configuration preferably generates and emits infrared frequencies only in the subject band. As a result, infrared radiation only of the filtered band is preferably emitted from or absorbed by the configuration for further processing. Hence, in case of an emitter, a device is suggested providing infrared emission preferably in a narrow band which in turn may be beneficial in powering the device and in enhancing the spectral flux in the subject band per power unit supplied. Another advantage is that selective emission in a narrow band facilitates selective excitation e.g. of molecules or atoms of a gas—analogous to the selective absorption of radiation. In case of the device being designed as a detector, background noise from frequencies outside the band can be reduced or eliminated by preferred selective absorption in the band only. Hence, by means of the present embodiment, an emissive or receptive spectrum of infrared radiation can be shaped to a desired band. The device as suggested in a preferred embodiment may be considered as wavelength selective in a range of wavelengths corresponding to the desired band, and hence either as a wavelength selective emitter or a wavelength selective detector.

The present device preferably can be used in gas sensing, spectroscopy, infrared imaging and/or signaling applications without limitation.

Hence, a broadband absorption layer in form of the electrically conducting layer arrangement is provided in/on the substrate, and preferably is integrated in a membrane spanning a recess manufactured into the substrate, as will be explained below. The electrically conducting layer arrangement preferably is taken from a standard layer stack, e.g. a CMOS layer stack, deposited on the substrate, as will be explained further below. Hence, the electrically conducting layer arrangement can be derived from materials and structures already present in the backend stack, which makes integration of the layer arrangement straightforward on an industrial scale.

Preferably, the substrate is a semiconductor substrate such as a silicon substrate, but in different embodiments the substrate may be a ceramic substrate or a substrate of a different material. An arrangement of the configuration on the substrate includes an arrangement directly on a surface of the substrate, or indirectly on any intermediate layer deposited on the substrate. Hence, it suffices that the substrate supports the configuration.

By means of the substrate supporting the thermal sensor or the heater as well as the configuration, a small-scale device can be manufactured. Preferably, all of the elements of the heater if any, thermal sensor if any, and configuration are arranged and/or integrated on or in the substrate, directly or indirectly, in a non-removable fashion. Such close arrangement may decrease electrical power required to operate the infrared emitter and/or lower optical power required to generate a signal of sufficient magnitude in the thermal sensor which in turn may reduce size of the device itself or the thermal sensor included in such a device. It is noted that the configuration may or may not include the thermal sensor and/or the heater.

In a preferred embodiment a recess is provided in the substrate, and a membrane spans at least a portion of the recess in the substrate. In such embodiment, it is preferred that the configuration is arranged on or in the membrane, or represents the membrane. The recess can be manufactured into the substrate by means of etching or otherwise removing material. The recess may go through the entire substrate and as such open the substrate from a backside thereof, while at a front side of the substrate opposite the backside a membrane is arranged spanning at least a portion of the recess. In a different embodiment, the recess does not lead through the entire substrate but forms a cavity in the front side of the substrate that at least is partially spanned by the membrane. In one embodiment, the membrane completely covers the recess without an exchange of gas through the membrane from the recess to the outside or vice versa. In a different variant, the membrane may contain holes for allowing such exchange. The membrane may also take the shape of a bridge bridging the recess and allowing gas to be exchanged between the recess and a volume outside the membrane. A bridge-shaped membrane may be applied to an emitter device, and/or to a detector device. The membrane may be formed from a material applied to the front side of the substrate. Such material may include a layer stack which may contain dielectric layers and metal layers, preferably alternating, and preferably such as used in CMOS processing (Complementary Metal Oxide Semiconductor). Once substrate material is removed, e.g. from the backside of the substrate, a membrane may remain e.g. made from all or at least some layers of the stack, or made from all the layers of the stack and additionally from a portion of the substrate.

A thermal sensor, if any, may be arranged on or in the membrane, too, e.g. in case the thermal sensor includes one or more thermocouples that may be placed such that hot junctions thereof are arranged on or in the membrane, and cold junctions thereof are arranged outside the membrane on the or in close thermal contact with the substrate for allowing to detect a difference in temperature. In a different embodiment, a temperature sensor is provided based on measuring a resistance change. An example for such a resistive temperature sensor is a bolometer that preferably comprises a resistive temperature sensor made from e.g. metal wires arranged in the stack, and preferably in or on the membrane if any. A thermal mass of the bolometer is represented by the configuration.

The heater, if any, preferably is arranged on or in the membrane, if any, too, and as such may heat the configuration. High temperatures can be achieved in the membrane by low power owed to the small dimension of the membrane. At the same time, a thermal conduction along the thin membrane is sufficiently small not to induce high temperatures in the rest of the semiconductor chip, which otherwise would impact any electronic circuitry which in one embodiment may be integrated in the substrate, e.g. by CMOS processing. The vast difference of thermal masses of membrane and substrate in addition ensure that the substrate may to a large extent remain at room temperature. Such electronic circuitry may be integrated for one or more of controlling the heater and/or for processing signals from the thermal sensor in form of a determination unit as will be explained later on.

A good thermal isolation is achieved, in case the configuration and the thermocouples or the resistive temperature sensor are arranged on or in a membrane. In such embodiment, an additional temperature sensor in form of a resistive wire or a thermocouple may be provided and arranged on or in the membrane for monitoring a temperature thereof. Preferably, the measured temperature is used for controlling a temperature of the membrane e.g. by a heater. By such means, it could be compensated for drifts induced by degradation of the heater if any during operation.

The configuration preferably comprises layers/material left over from a stack of layers deposited on the substrate e.g. within CMOS processing the substrate, wherein the stack of layers preferably is a stack of CMOS layers deposited on the substrate. Such layer stack typically includes dielectric and electrically conductive layers arranged in alternating fashion. A dielectric layer may be made from one of Silicon Oxide, such as $SiO_x$ where x may vary, x=1, 2, . . . , or Silicon Nitride, such as SiN, for example. A conductive layer may e.g. be a metal layer, e.g. made from one of Al, Cu. The stack may additionally include semiconducting layers. In case of a membrane being formed by the layer stack, the configuration may be formed by the respective layers in the portion of the stack spanning the recess, which is the membrane.

It is preferred that the electrically conducting layer arrangement represents a layer arrangement available in the layer stack, e.g. a CMOS layer stack, arranged on the substrate. Hence, a structure already existing in the layer stack is used for infrared detection or emission purposes, however, with the stack experiencing treatment prior to making use of the subject layer arrangement for infrared purposes. Preferably, the electrically conducting layer arrangement is one of an adhesion layer for adhering the inter metal dielectric to a metal layer of the layer stack, and/or a diffusion barrier for preventing diffusion between the inter metal dielectric and a metal layer. Accordingly, it is assumed that a metal element in the layer stack not only comprises the metal layer—such as Al or Cu—, but underneath and above provides for a thin electrically conductive layer arrangement—be it a single layer, a double layer or a multi-layer—that either serves for adhering the metal layer to the adjacent inter metal dielectric or that serves as diffusion barrier for protecting the metal layer. Such electrically conductive layer arrangement has a considerably lower thickness than the metal layer itself to which it is attached to. While the metal layer may have a thickness of typically more than 100 nm, the electrically conducting layer arrangement attached to it on both sides preferably has a thickness of less than 50 nm.

However, in contrast to its original arrangement in the layer stack, the electrically conducting layer arrangement in the present invention is no longer arranged between the metal layer on the one hand and the inter metal dielectric on the other hand, but is arranged between dielectric layers on both sides.

Preferably, when using a metal element of a layer stack, e.g. a CMOS layer stack, the electrically conducting layer arrangement used for infrared purposes preferably is the lower one, i.e. the electrically conducting layer arrangement in a vertical direction towards the substrate. Hence, the dielectric layer underneath the electrically conducting layer arrangement is an inter metal dielectric of the layer stack. Instead, the dielectric layer on top of the electrically conducting layer arrangement is a dielectric layer explicitly applied to the electrically conducting layer arrangement, such as a passivation layer, and in particular a Silicon Nitride or Silicon Oxide layer, in particular after having removed the metal layer and the electrically conducting layer arrangement on top of the metal layer. In an embodiment, the passivation layer has a thickness below 2000 nm, and preferably between 400 and 800 nm.

Preferably, the electrically conducting layer arrangement comprises or consists of an interstitial compound comprising one of the metals of group VI to VIII, and preferably of nitride embedded into a metal structure. In one embodiment, the electrically conducting layer arrangement comprises or consists of a Ti layer and a TiN layer. The Ti layer preferably has a thickness in the range of 1 to 49 nm, more preferably between 4 and 10 nm. The TiN layer preferably has a thickness in the range of 1 to 49 nm, more preferably between 4 and 20 nm. In a different embodiment, the electrically conducting layer arrangement comprises or consists of a Ta layer and a TaN layer. In a further embodiment, the electrically conducting layer arrangement comprises or consists a layer of one of Al, Cu, Pt, W.

The dielectric layer on top of the electrically conducting layer arrangement preferably comprises a dielectric tuning layer between the passivation layer and the electrically conducting layer, for tuning the configuration to the desired thickness. In an embodiment, the dielectric tuning layer is a Silicon Nitride or Silicon Oxide layer. Preferably the dielectric tuning layer has a thickness in the range of 200 to 2000 nm, e.g. 1500 nm.

A particular embodiment of the configuration comprises the following layers from top to substrate: 600 nm Silicon Nitride, 20 nm TiN, 5 nm Ti, 400 nm Silicon Oxide, and 200 nm Silicon Nitride, preferably each value within a tolerance of +/−10%. Such configuration leads to an emissivity peak around 4.3 micrometers, and is well suited for application in the detection of CO2.

In other particular embodiments of the configuration the top Silicon Nitride layer may have a different thickness leading to emissivity peaks at other frequencies: a main emissivity peak around 3 micrometers for a thickness of the top Silicon Nitride layer of 400 nm, or main emissivity peaks around 2.3 and 5.5 micrometers for a thickness of the top Silicon Nitride layer of 800 nm.

A more general embodiment of the configuration comprises the following layers from top to substrate: 200 to 2000 nm Silicon Nitride, TiN and Ti layers with thicknesses given above, 100 to 2000 nm Silicon Oxide, 100 to 2000 nm Silicon Nitride, 100 to 1000 nm Silicon Oxide, 100 to 1000 nm Silicon Nitride, 100 to 1000 nm Silicon Oxide. The latter two layers are not optically active, and hence could be left out. In addition, a heater, e.g. a tungsten heater, may be embedded in the configuration, e.g. in the second Silicon Oxide layer.

By tuning the top Silicon Nitride thickness, the emissivity may be tailored for a certain wavelength, or for two or more wavelengths. In this way, for mid IR gas sensing applications, certain unwanted cross-sensitivities may be suppressed or partially suppressed, e.g. a cross-sensitivity to water with absorption lines around 3 micrometers.

For certain applications, it may be desirable to have good emissivity in a broad range of wavelengths, e.g. for multi-gas sensing like a detection of several anesthetic agents, which additionally have absorption lines in the range of 10 micrometers. By tuning the Ti and TiN layer thicknesses and/or introducing a dielectric tuning layer in addition to the passivation layer, the emissivity spectrum may be broadened.

An embodiment of the configuration comprises the following layers from top to substrate: 350 nm Silicon Nitride, 4.5 nm TiN, 5 nm Ti, 400 nm Silicon Oxide, and 200 nm Silicon Nitride, preferably each value within a tolerance of +/−10%. Such configuration leads to an emissivity maximized and tuned for smoothness around 4 micrometers.

A different embodiment of the configuration comprises am additional Silicon Oxide layer on top of the Silicon Nitride layer, in particular the following layers from top to substrate: 1250 nm Silicon Oxide, 1500 nm Silicon Nitride, 4.2 nm TiN, 5 nm Ti, 820 nm Silicon Oxide, preferably each value within a tolerance of +/−10%. Such configuration leads to an emissivity spectrum with increased emissivity in the long-wavelength range, e.g. up to the range of 10 micrometers. In particular such configuration yields an emissivity spectrum of the infrared device which has an emissivity in the range of 60% to 100% of a maximum emissivity in the wavelength range between 4 and 10 micrometers.

In addition to the electrically conducting layer arrangement, the configuration may comprise an electrically conducting layer stack, representing e.g. a metal element of the layer stack. As is explained above, such electrically conducting layer stack preferably is arranged between dielectric layers, preferably has a thickness of more than 100 nm, and preferably is arranged between the electrically conducting layer arrangement and a bottom layer of the configuration. It is preferred that the electrically conducting layer stack comprises or consists of a metal layer arranged between two further electrically conducting layer arrangements. Accordingly, in this embodiment the electrically conducting layer arrangement serving for infrared detection/emission is not built from the bottom most level of metal elements— referred to as M1 metal layer in the layer stack—but is built from a metal element in at least the next level—referred to as M2 metal layer in the layer stack. The purpose of the integration of such electrically conducting layer stack also referred to as metal element may be two-fold: On the one hand, and in one embodiment of the present invention, the metal layer of this electrically conducting layer stack may together with another electrically conducting layer of a different material be electrically connected to form one or more thermocouples serving as thermal sensor, or may possibly contribute to implement a heater. On the other hand, the integration of such electrically conducting layer stack may serve as a mirror for reflecting incident infrared radiation, and hence support an infrared detector that only can sense infrared radiation from one side, e.g. from above given that the electrically conducting layer stack is arranged between the electrically conducting layer arrangement and the thermal sensor: Infrared radiation incident from the side of the thermal sensor may only slightly be absorbed owed to a lack of an absorbing element on this side while the electrically conducting layer stack reflects the incident infrared radiation to a large extent owed to its thickness. However, infrared radiation incident from the side of the electrically conducting layer arrangement may largely be absorbed by the electrically conducting layer arrangement on this side, and non-absorbed infrared radiation travelling through to the electrically conducting layer stack may be reflected there owed to its thickness and again pass the electrically conducting layer arrangement and be absorbed there. Accordingly, this embodiment also improves the sensitivity of the infrared detector.

According to another aspect of the invention, an infrared device according to any of the above embodiments is used and/or arranged as an infrared detector, wherein the thermal sensor is included rather than the heater. The infrared detector, however, may be exposed to broadband infrared radiation e.g. being received from a measuring volume that is in turn irradiated by an infrared heater, and preferably by an infrared heater of one of the previous embodiments. It is preferred in such scenario, that the configuration of the infrared emitter and the configuration of the infrared detector are identical such that the emitter selectively emits infrared radiation in the defined band into the measurement volume, and the detector selectively absorbs infrared radiation in the defined band, which is the portion of the selectively emitted radiation that is not absorbed by the gas compound to be detected. The signal supplied by the thermal sensor of the infrared detector may be evaluated by a determination unit and may indicate a concentration of the gas compound within the gas in the measuring volume.

In one embodiment, the infrared device comprises an encapsulation for sealing a volume at one or both sides of the membrane or the substrate. The sealed volume may reduce the effect of heat conduction or convection to/from ambient air. The sealed volume may be evacuated or filled by a protective gas. Such encapsulation preferably includes a window for allowing the configuration to be exposed to the infrared radiation. The encapsulation can also be applied to a device including one or more thermocouples as thermal sensor, and to an infrared emitter.

According to a further aspect, an infrared based sensor is provided which comprises a volume between the infrared emitter and the infrared detector for accepting a gas to be investigated as to the presence or absence and/or the concentration of a specific gas compound in that gas. Given that the concept of infrared based sensing includes the gas compound to absorb radiation of the band/wavelength the emitter and the detector are tuned to selectively emit/absorb, and specifically to build a relation between the radiant flux at this wavelength at the emitter and the radiant flux at this wavelength at the detector after travelling the volume, an amount of radiation absorbed by the gas compound present in the volume can be derived which is proportional to a concentration of this gas compound in the volume. Emitter and detector can be arranged in a common plane, e.g. on a common carrier, and may be arranged at different ends of the common carrier. A reflector may be provided in the infrared based sensor for deflecting the emitted radiation towards the detector.

It is preferred that the detector includes an encapsulation for sealing a volume at one or both sides of each of the substrate/membranes. In such embodiment, a window is provided in the encapsulation for allowing the configurations of the detector to be exposed to the infrared radiation, which window is coupled to the volume between the emitter and the detector. A window may also be provided in an encapsulation of an emitter which may prevent convection from ambient air to impact a temperature distribution on a membrane of the emitter.

For example, a gas compound to be detected is $CO_2$. Such gas sensor can be realized at chip scale, hence requiring a chip area of few $mm^2$, wherein commercial $CO_2$ sensors, for example, require a footprint on the order of several $cm^2$, which prohibits their deployment in applications where small sensor dimensions are important such as in mobile applications including mobile phones, tablets, etc.

It is preferred to integrate circuitry in the detector which circuitry is configured to filter the signals of the thermal sensor/s, amplify, and calibrate on-chip, thus limiting noise pick-up from the environment to a minimum. Such circuitry preferably is integrated into the substrate of the detector.

It is preferred to integrate circuitry in the emitter which circuitry is configured to control the heater, and calibrate on-chip, thus limiting noise pick-up from the environment to a minimum. Such circuitry preferably is integrated into the substrate of the emitter.

According to another aspect of the present invention, a method is provided for manufacturing an infrared device. A wafer is provided including a substrate and a layer stack, e.g. a CMOS layer stack, arranged on the substrate, which layer stack includes at least one metal layer arranged between two electrically conducting layer arrangements of less than 50 nm thickness each serving as one or more of an adhesion layer and a diffusion barrier between the metal layer and inter metal dielectrics next to each of the electrically conducting layer arrangements. In a first step the inter metal dielectric arranged on top of an upper of the electrically conducting layer arrangements as well as the upper electrically conducting layer arrangement is removed. Next the metal layer is removed. Finally, a dielectric layer is deposited on the lower of the electrically conducting layer arrangements released by the removal of the metal layer. Accordingly, the layer stack is modified such as to release the bottom electrically conducting layer arrangement of an electrically conducting layer stack, which electrically conducting layer arrangement originally promotes adhesion or prevents diffusion into the removed metal layer.

Preferably, the top inter metal dielectric and the upper electrically conducting layer arrangement are removed in a common etching step. The metal layer preferably is removed in a separate etching step.

In a specific embodiment, a Ti/TiN layer sandwich with corresponding thicknesses in the order of 8 nm and 20 nm, and preferably 4 to 20 nm TiN and 4 to 10 nm Ti, in a thermopile membrane, e.g. a CMOS thermopile membrane, is used as electrically conducting layer arrangement for infrared sensing or emitting. The layer sandwich preferably is derived from the adhesion/diffusion barrier layers on the bottom of the aluminum metallization layers used in the CMOS process.

For structuring the thermopile membrane, it is preferred to apply an etch stop layer integrated in the form of a plate-like structure patterned on one of the metallization layers of the backend stack that allows for controlling the thickness of the thermopile membrane. The etch stop layer preferably is removed in a wet etching process. The Ti/TiN arrangement under the aluminum normally is removed in an extra etching step. However, by skipping this step, the Ti/TiN bi-layer can be kept in the membrane, as the aluminum etch is highly selective with respect to Ti and TiN. The remaining bi-layer arrangement has been experimentally shown to significantly increase infrared absorption in the wavelength band of ~4 µm, relevant for CO2 detection.

The subject gas sensor preferably can be manufactured compatible to CMOS processing and hence is compatible with wafer-scale fabrication schemes.

Any feature disclosed applies to both an infrared emitter and an infrared detector.

BRIEF DESCRIPTION OF THE DRAWINGS

Embodiments of the present invention, aspects and advantages will become apparent from the following detailed description thereof. Such description makes reference to the annexed drawings, wherein the figures show.

DETAILED DESCRIPTION OF THE DRAWINGS

Same elements are referred to by same reference numerals across all figures. Although it is referred to a CMOS layer stack in the following examples, any other layer stack may be applicable, too.

Figure 1:
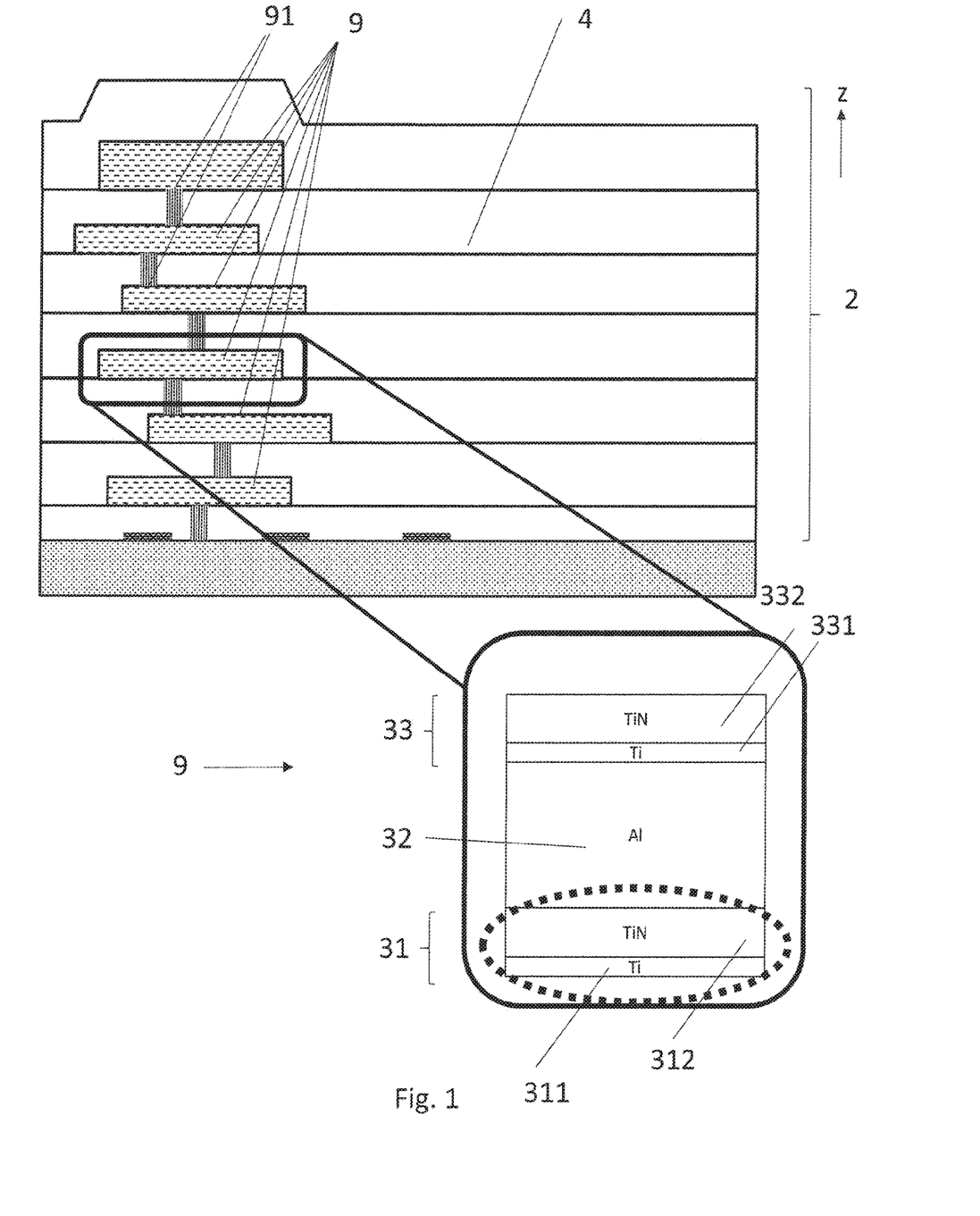
FIG. 1 a cut through a CMOS layer stack as used in a method for manufacturing an infrared device, according to an embodiment of the present invention.

FIG. 1 illustrates a cut through a CMOS layer stack 2 such as used in a method for manufacturing an infrared device according to an embodiment of the present invention. The CMOS layer stack comprises various metal elements 9 and inter metal dielectrics collectively referred to as inter metal dielectrics 4. Such CMOS layer stack 2 is generated by depositing metal and dielectric material on a substrate, such as a semiconductor and in particular a silicon substrate, and by structuring the material. Presently, the CMOS layer stack 2 comprises six metal elements 9 arranged on six different levels in vertical direction z originally separated by the various inter metal dielectrics referred to by "IMDxy". Presently, electrically conducting vias 91 are already manufactured between neighboring metal elements 9 in order to allow electrically conducting paths throughout the entire CMOS layer stack 2 in vertical direction z.

The metal element 9 on the second level from the bottom is zoomed in and is shown in more detail below: Such metal element 9 includes a stack of layers, wherein a core layer is referred to as metal layer 32 presently made from aluminum Al. In the CMOS layer stack 2, this metal layer 32 is provided as electrically conducting path for interconnecting elements. The metal layer 32 is sandwiched between two electrically conducting layer arrangements, the upper of which in z-direction is referred to by 33, and the lower of which in z-direction is referred to by 31. Each of the electrically conducting layer arrangements 31 and 33 comprises a first layer 311, and 331, respectively, presently made from titanium Ti, and a second layer 312, and 332, respectively, made from titanium nitride TiN. Presently, each electrically conducting layer arrangement 31 and 33 serves the purpose of one or more of an adhesion layer for adhering the inter metal dielectric 4 to the metal layer 32, and a diffusion barrier for preventing diffusion between the inter metal dielectric 4 and the metal layer 32.

Figure 2:
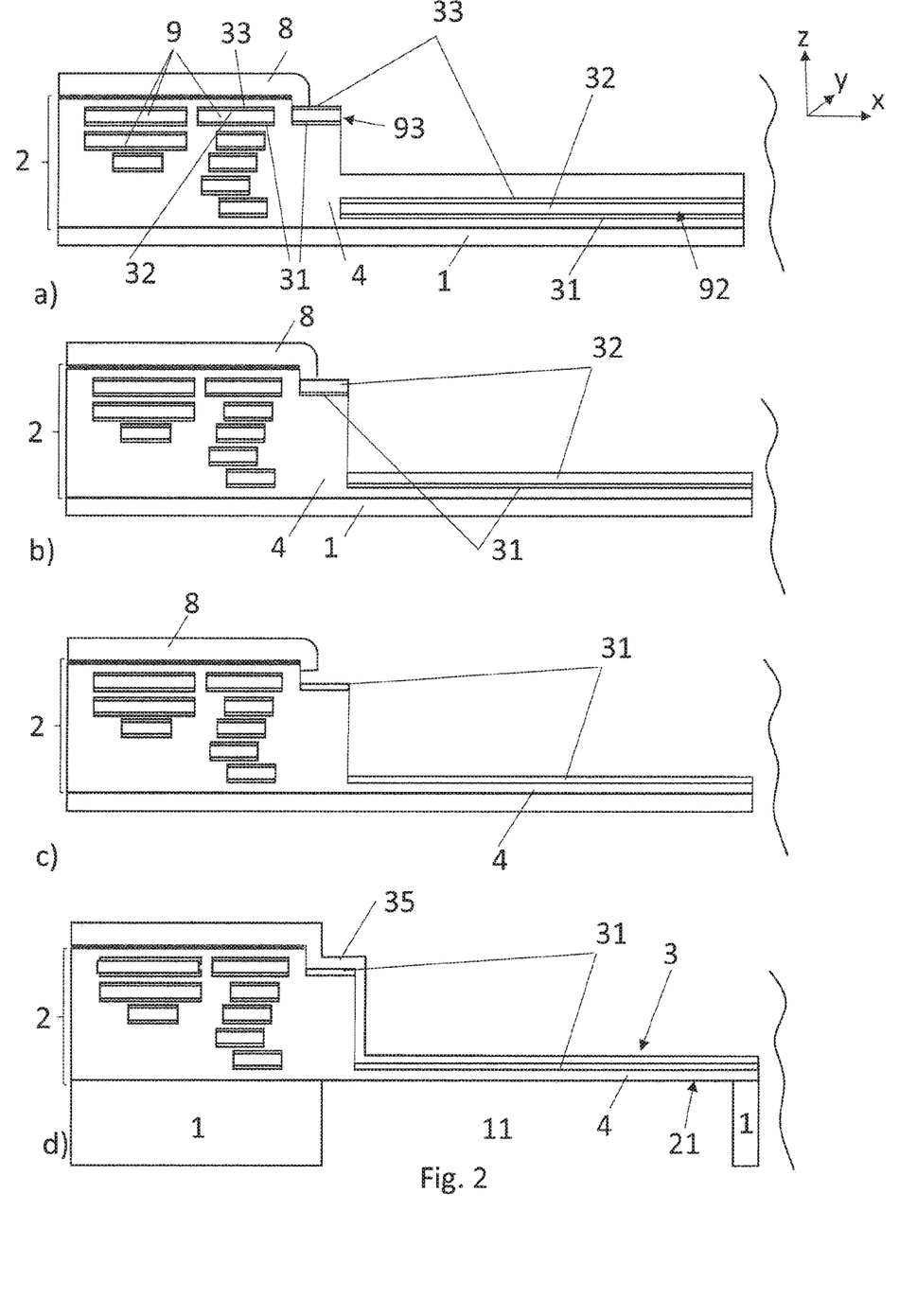
FIG. 2 a method for manufacturing an infrared device, according to an embodiment of the present invention.

FIG. 2 illustrates in diagrams a) to d) steps for manufacturing an infrared device according to an embodiment of the present invention. In diagram 2a) a wafer is provided including a substrate 1 and a CMOS layer stack 2 arranged on the substrate 1. The substrate 1 does not scale with respect to the CMOS layer stack 2 but is shown much thinner than in real life compared to the CMOS layer stack 2. The substrate preferably is a semiconductor substrate 1. A photo resist 8 is arranged on top of the wafer.

The CMOS layer stack 2 comprises metal elements 9 on various levels of the CMOS layer stack 2, and already structured in the horizontal plane x,y. Between the metal elements 9, inter metal dielectric 4 is provided for electrically disconnecting the metal elements 9 from each other. Each metal element 9 includes an electrically conducting layer stack such as is shown for the metal elements 9 in FIG. 1, for example. In particular, it is assumed that each metal element 9, and hence, each electrically conducting layer stack comprises a metal layer, such as the metal layer 32 of FIG. 1 made from Al, arranged between two electrically conducting layer arrangements, such as the arrangements 31 and 33 comprising a layer 311, 331 of Ti, and a layer 312, 332 of TiN, see FIG. 1, again serving for one or more of adhesion or diffusion barrier purposes. Some of the metal elements 9 shown in the wafer of diagram 2a), especially those on the left hand side of the wafer, may be structured and arranged for providing electrical conducting paths within the inter metal dielectric for later on connecting electronic elements integrated into the substrate 1.

On the right hand side of the wafer of diagram 2a), any upper metal elements are either completely removed or were not deposited from the beginning, such that only a bottom most metal element 92 extends horizontally while no further metal levels are provided on levels above this bottom most metal element 92. In addition, to the left of the bottom most metal element 92, metal element is provided to allow for structuring a step.

The infrared device as shown in diagram 2a) may further extend to the right as is indicated. The state as shown in diagram 2a) is an intermediate state during the manufacturing of an infrared device, which manufacturing makes use of the layers typically present in a CMOS layer stack 2.

According to diagram 2b), in a next manufacturing step any inter metal dielectric 4 on top of the bottom most metal element 92 is removed, preferably by way of wet etching or dry etching. In such etching step, the upper electrically conducting layer arrangement 33 is removed together with the inter metal dielectric 4. The metal layers 32 of each metal element 92 and 93 serve as an etch stop in this manufacturing step, such that the metal layers 32 of each metal element 92 and 93 are exposed as is shown in diagram 2b).

According to diagram 2c), the metal layers 32 of the metal elements 92 and 93 as exposed in response to the manufacturing step of diagram 2b) are now removed in a separate etching step, preferably by means of wet etching. The result is shown in diagram 2c): The lower electrically conducting layer arrangement 31 of each metal element 92 and 93 serves as etch stop and now is released. Preferably, the now released electrically conducting layer arrangements 31 each comprise a metal layer and a metal nitride layer such as is shown in FIG. 1.

In the following step illustrated in diagram 2d), the photo resist 8 is removed, and in particular the released electrically conducting layer arrangements 31 are now covered with a dielectric layer 35, preferably in form of a passivation layer made from Silicon Nitride. In addition, a recess 11 is etched into the substrate 1 which makes the remaining layers form a thin membrane 21 thermally insulating the membrane 21 from the substrate 1 to a large extent.

In particular, the leftovers of metal element 92 which completely are arranged in the membrane 21, in combination with the leftover inter metal dielectric 4 and the dielectric layer 35, and possibly any other layer comprised in the membrane 21, forms a configuration 3 with the electrically conducting layer arrangement 31 absorbing or emitting infrared radiation, but previously serving as lower adhesion layer or diffusion barrier for the metal layer 32 removed in the meantime. Accordingly, layer/s of the CMOS layer stack, which previously were serving the protection of the metal layer 32 now are used for the complete different purpose of infrared sensing/emitting.

Figure 3:
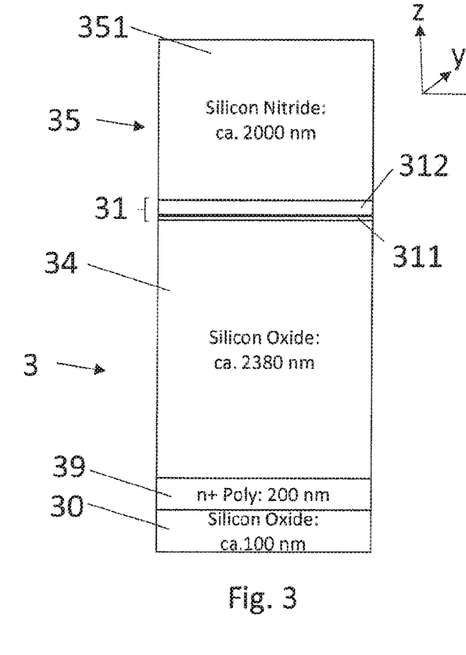
FIGS. 3 to 6 configurations in cut view as used in infrared devices according to embodiments of the present invention.

FIG. 3 illustrates a configuration 3 as used in an infrared device according to an embodiment of the present invention. So do each of FIGS. 4 to 6. It is understood, that each configuration 3 may be arranged on a substrate, or, in an alternate embodiment, may form a membrane arranged on and preferably spanning a recess manufactured in the substrate. Each may additionally include one of a heater to form an emitter, or one of a sensor to form a detector.

While these embodiments are described by referring to the layers contributing to the configurations, individual materials and thicknesses of the individual layers are suggested in each of the FIGS. 3 to 6. These materials as well as the thicknesses are only considered as preferred embodiments. Other materials may be applied according to the constraints presented earlier in the application. For each layer thickness provided, it is assumed that an alternative thickness may be found in the range of the given layer thickness+/−20 percent.

According to the cut view of FIG. 3, the configuration 3 includes an electrically conducting layer arrangement 31, presently comprising a Ti layer 311 and a TiN layer 312. A dielectric 35 is arranged on top of the electrically conducting layer arrangement 31, such as a passivation layer 351, e.g. made from Silicon Nitride. Underneath the electrically conducting layer arrangement 31, in −z-direction, another dielectric 34 is provided, e.g. in form of an inter metal dielectric, such as made from Silicon Oxide. A bottom layer 30 of the configuration 3 may be another dielectric layer, such as a Silicon Oxide layer. Between layers 30 and 34, a polysilicon layer 39 is arranged. Accordingly, the present configuration 3, when e.g. representing a membrane, may in vertical direction z be confined by the top most dielectric 35 and the bottom layer 30.

The frequency of infrared radiation absorbed or emitted by the configuration 3 of an infrared device may also depend on the overall thickness of the configuration 3. The overall thickness of the configuration of the embodiment of FIG. 3 may be given by an accumulation of the thicknesses of the individual layers contributing to the configuration 3. The configuration of FIG. 3 with the indicated thicknesses yields several emissivity peaks in the range of 2 to 6 micrometers.

Figure 4:
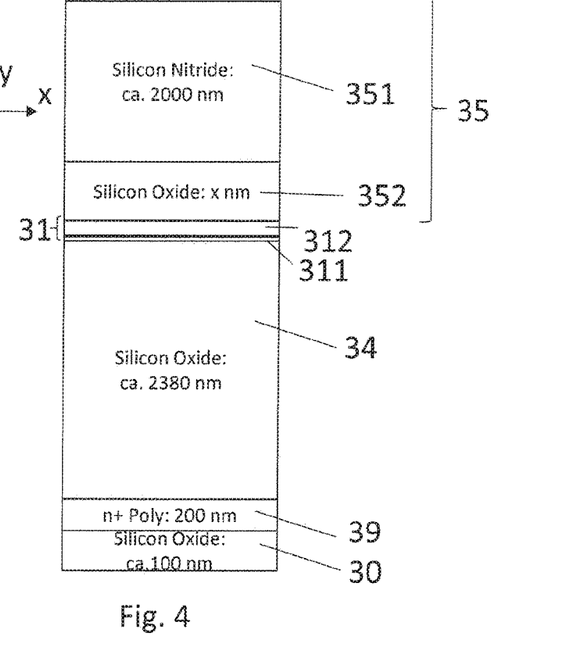

However, in case the overall thickness is desired to be tuned in order to manipulate the frequency sensitivity of the configuration 3, the top most dielectric 35 may not only comprise the passivation layer 351, but also an additional dielectric layer 352, e.g. in form of an Silicon Oxide layer deposited on the electrically conducting layer arrangement 31. The corresponding configuration is shown in FIG. 4. By such means, the overall thickness of the configuration is tuned, and may be adjusted so as to optimize the sensitivity of infrared frequencies in a desired range. In a different embodiment, the passivation layer 351 is a Silicon Oxide layer, and the additional dielectric layer 352, if any, is a Silicon Nitride layer. Simulations show a desired emissivity spectrum also in that case.

Figure 5:
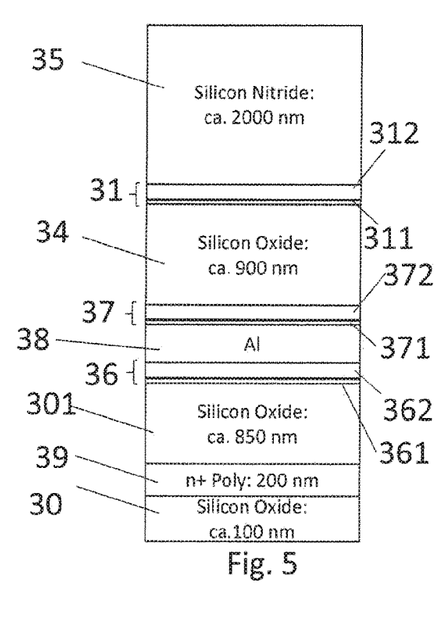

The configuration of FIG. 5 differs from the configuration of FIG. 3 in that between the electrically conducting layer arrangement 31 and the bottom most layer 30 an electrically conducting layer stack 36, 37, 38 is included, which preferably represents a metal element 9 as introduced in FIG. 1. Such electrically conducting layer stack 36, 37, 38 comprises a metal layer 38, and associate electrically conducting layer arrangements 36 and 37, again originally serving as adhesion layer and/or diffusion barrier. However, in contrast to the embodiment of FIG. 3, the present metal element remains in the CMOS layer stack 2 and is not partially removed. Accordingly, in the embodiment of FIG. 5, the electrically conducting layer stack 36, 37, 38 may represent a full metal element 9 according to FIG. 1, e.g. of metal layer M1 in a conventional CMOS layer stack. As such, the electrically conducting layer stack 36, 37, 38 preferably shows a thickness of 100 nm and more, wherein the metal layer 38, such as made from Al, requires a majority of the stack thickness, while the adjacent electrically conducting layer arrangements 36 and 37 are of minor contribution to the overall thickness. The adjacent electrically conducting layer arrangements 36 and 37 preferably are made from the same materials as the electrically conducting layer arrangement 31.

Accordingly, another inter metal dielectric is introduced, referred to as layer 301, e.g. made from Silicon Oxide. In this context, the polysilicon layer may be considered as electrically conducting layer 39 that is arranged between the other electrically conducting layer stack 36, 37, 38 and the bottom most layer 30. The electrically conducting layer stack 36, 37, 38 and the electrically conducting layer 39 preferably contribute to one or more thermocouples, and as such are at least connected once, e.g. by means of a via through layer 301. Such one or more thermocouples, e.g. contributing to thermopiles, preferably serve as thermal sensor for receiving the thermal energy absorbed by the configuration. Accordingly, the present configuration also includes means for measuring the absorbed infrared radiation.

In all FIGS. 3 to 6, layer 39 is optional, but preferred if contributing to a thermocouple, for example.

Figure 6:
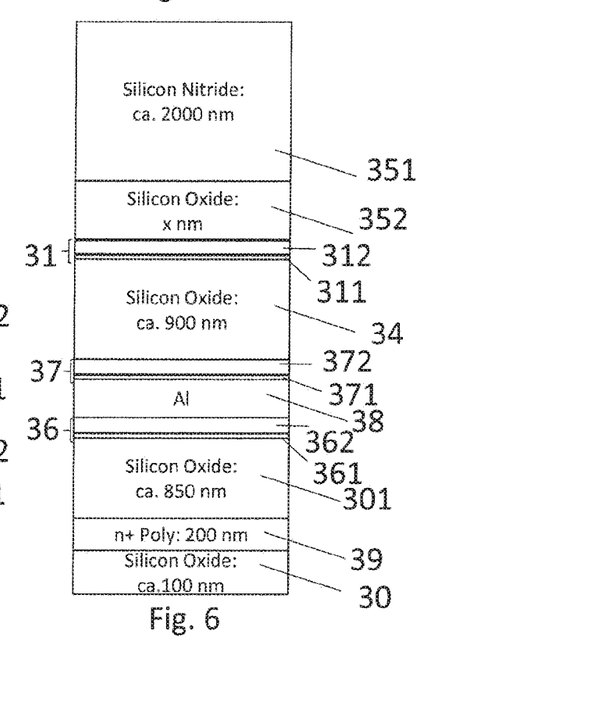

FIG. 6 shows another embodiment of a configuration, representing a combination of the embodiments shown in FIGS. 4 and 5. Accordingly, the present configuration includes the electrically conducting layer stack 36, 37, 38 and the electrically conducting layer 39 for possibly contributing to a thermocouple or thermopile, and at the same time a thickness tuning element in form of layer 352.

Figure 7:
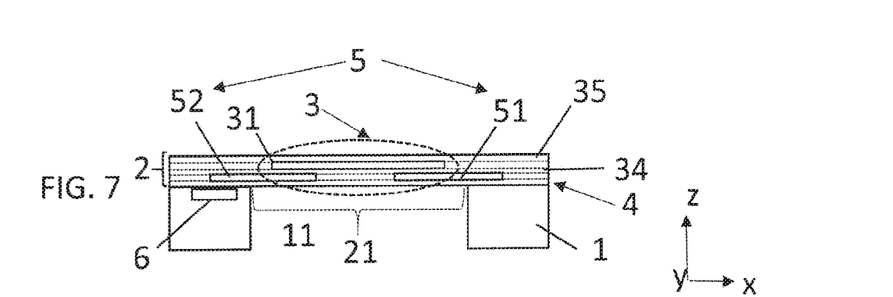
FIGS. 7 to 11 infrared devices according to embodiments of the present invention.

FIG. 7 illustrates a cut through an infrared device according to an embodiment of the present invention. It is assumed that this infrared device is exposed to infrared radiation incident from outside the device. The device comprises a substrate 1 and a stack of layers 2 arranged on the substrate 1. The substrate 1, which preferably is a semiconductor substrate, has a recess 11 through an entire thickness of the substrate 1, the recess 11 being made e.g. from etching or otherwise removing material from the substrate 1. The recess 11 generates a membrane 21 made from the layer stack 2 spanning the recess 11 in the substrate 1. The layer stack 2 comprises multiple layers, one of which is an electrically conducting layer arrangement 31 such as introduced in the previous Figures. The infrared device according to FIG. 7 may also be referred to as semiconductor chip comprising the bulk substrate 1, such as silicon bulk material, which is covered a CMOS layer stack 2 as defined in CMOS processing, but which is processed afterwards in order to enable infrared detection. The layer stack 2 preferably is used for building a configuration 3—referred to by a dotted ellipse—designed for absorbing infrared radiation.

Presently, the electrically conducting layer arrangement 31 extends only across or within the membrane 21 in the x-y plane of the device. Otherwise a thermal short may be achieved to the substrate 1 thereby reducing the responsivity and/or sensitivity.

The infrared device of FIG. 7 comprises a thermal sensor 5 in form of two thermopiles indicated by reference numerals 51 and 52. The thermopiles 51 and 52 are preferably made from a metal and/or a polysilicon layer of the layer stack 2, such as is introduced in the embodiments of FIGS. 5 and 6. Each thermopile 51, 52 includes a multitude of thermocouples connected to each other at junctions. The junctions reside either on the membrane 21 or outside the membrane 21 on the substrate 1 such that a thermal difference can be detected, wherein the hot junctions of the thermopiles reside on the membrane 21 and are arranged to sense a temperature difference of the membrane 21 at these hot junctions with respect to the temperature of the substrate 1 which temperature is proportional to the radiation emitted by the configuration 3. Hence, the infrared radiation applied to and absorbed by the configuration 3 is converted into heat which heat is sensed by the thermal sensor 5. A circuitry 6 may be integrated into the substrate 1, e.g. a silicon substrate, serving as determination unit for evaluating signals provided by the thermal sensor 5.

Figure 8:
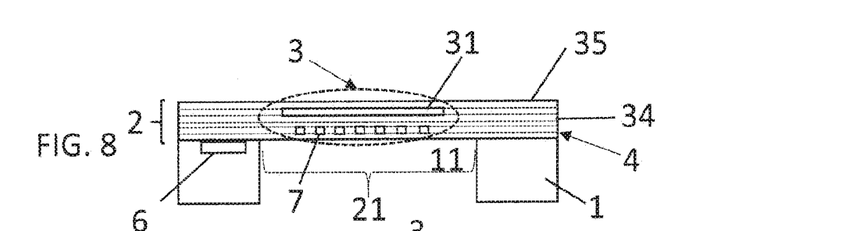

FIG. 8 illustrates a cut through an infrared device according to another embodiment of the present invention. Many elements are identical to the embodiment of FIG. 7 and are therefore not labelled again in view of enhancing illustration. The infrared device of FIG. 8 differs from the device of FIG. 7 in that it is an infrared emitter instead of an infrared detector.

A heater 7 is arranged in a metal layer of the stack of layers 2, e.g. in form of a resistive heater a few meandering lines of which are indicated in FIG. 8. The heater 7 is arranged for heating the configuration 3. Preferably, electronic circuitry 6 is integrated into the infrared device which circuitry may be connected to the heater 7 and be configured to control the heater 7, e.g. by switching a power switch on or off. Hence, the configuration 3 and the heater 7 are arranged in the membrane 21 above the recess 11. This arrangement is owed to reducing a heat transfer from the membrane 21 to the rest of the substrate 1.

By switching on the heater 7 and applying heat to the configuration 3, the configuration 3 is triggered to emit infrared radiation.

Figure 9:
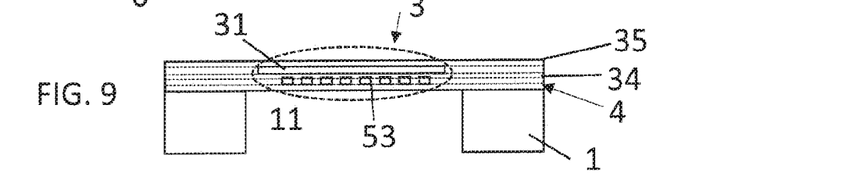

FIG. 9 illustrates another cut through an infrared device according to a further embodiment of the present invention. The infrared device of FIG. 9 again is an infrared detector and differs from the detector of FIG. 7 in that instead of thermopiles 51, 52 a bolometer 53 is used as thermal sensor. The bolometer 53 presently comprises a resistive temperature sensor 53 made from conductive structures, such as metal wires, arranged in the membrane 21, and preferably from one of the conductive layers of the stack 2, preferably a layer underneath the layers contributing to the electrically conducting layer arrangement 31. In combination with the configuration 3, and supported by a good thermal isolation provided by the membrane 21, the resistive temperature sensor 53 builds the bolometer.

Figure 10:
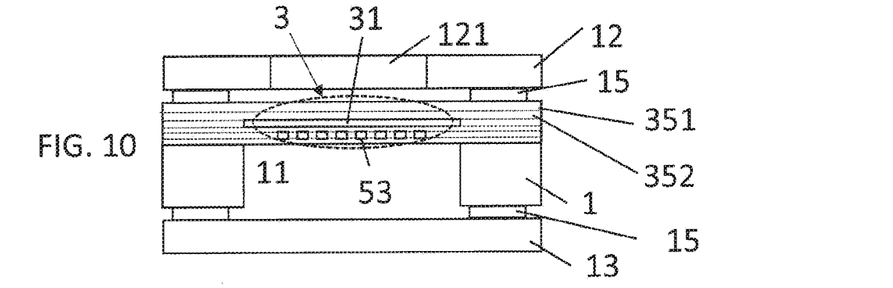

The infrared detector of FIG. 10 differs from the infrared detector of FIG. 9 in that a volume on both sides of the membrane 21 is limited by an encapsulation. The encapsulation is made from two substrates 12 and 13, e.g. silicon substrates, bonded to the stack of layers 2 or to the substrate 1 by suitable means, e.g. by an adhesive 15. The volume in the encapsulation may be evacuated or may be filled with a protection gas in order to enhance infrared transmission.

Figure 11:
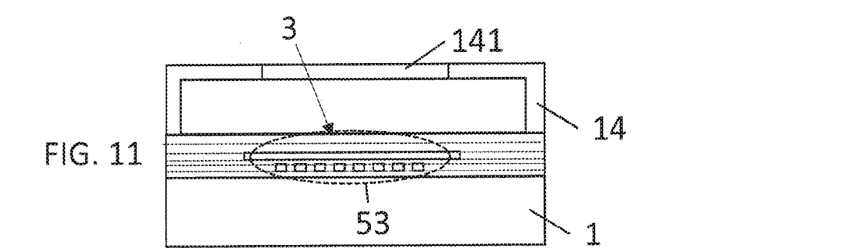

A different variant of encapsulation is shown in FIG. 11. A single cap 14 is used as encapsulation, which cap preferably is attached to the layer stack 2, e.g. by bonding. In the present example, the substrate 11 does not have a recess 11 such that there is no backside of a membrane to be evacuated.

In both embodiments of FIG. 10 and FIG. 11, infrared radiation from a measurement volume outside the device is desired to meet the configuration 3 of the device such that a window 121 and 141 respectively is arranged in the encapsulation 12 or 14, respectively, which window 121, 141 preferably is transmissive in the infrared spectrum. The window 121, 141 is integrated in the encapsulation 12 and 14 respectively and preferably faces the configuration 3.

Figure 12:
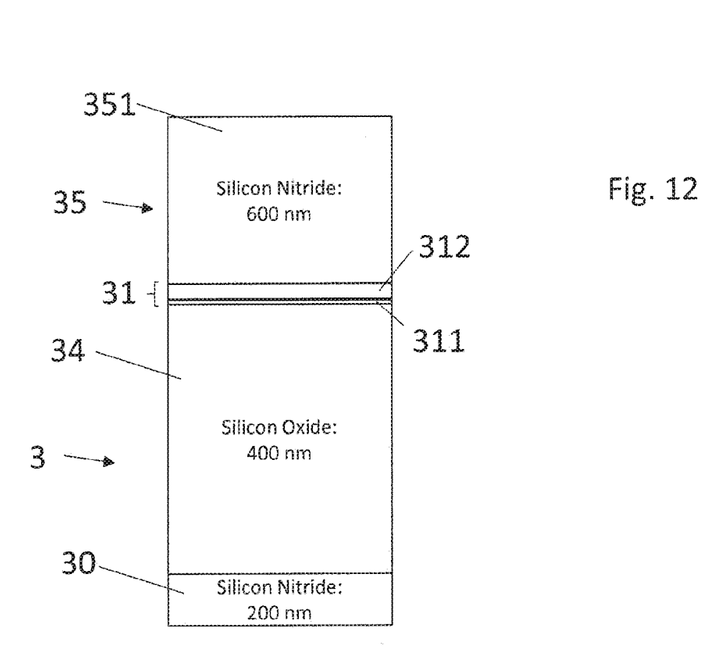
FIG. 12 another configuration in cut view as used in an infrared device according to an embodiment of the present invention.

FIG. 12 shows another configuration in cut view as used in an infrared device according to an embodiment of the present invention, which has specifically been designed for application in the detection of CO2. As in FIGS. 3-6, the configuration 3 comprises from top to substrate (not shown) a passivation layer 351, an electrically conducting layer arrangement 31 as well as dielectric layers 34 and 30. The electrically conducting layer arrangement 31 comprises a first layer 311 of Ti with a thickness of 5 nm and a second layer 312 with a thickness of 20 nm. The configuration 3 may additionally comprise a heater (not shown).

Figure 13:
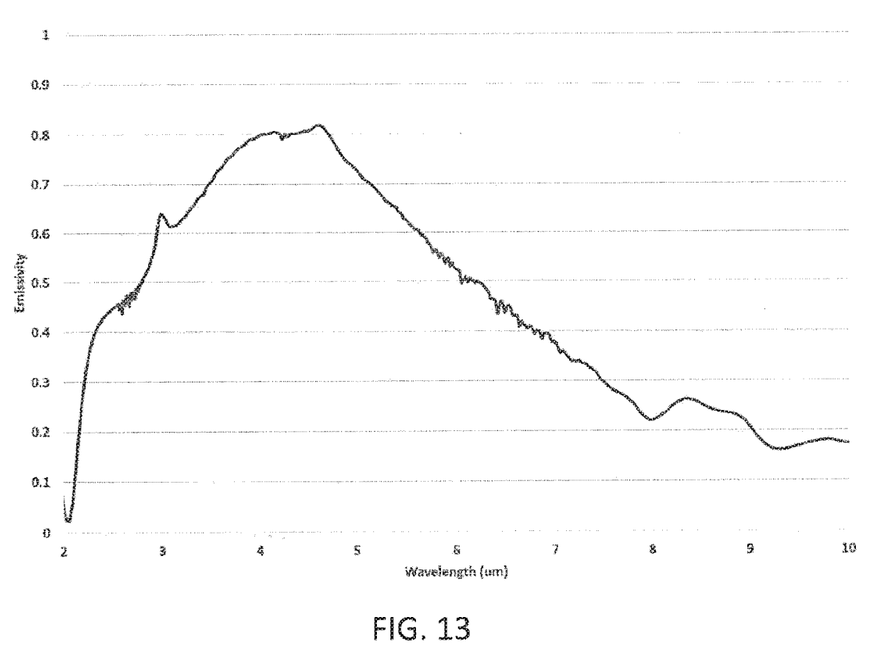
FIG. 13 an emissivity spectrum of the configuration of FIG. 12 as measured using FTIR spectroscopy.

FIG. 13 illustrates an emissivity spectrum of the configuration 3 of FIG. 12 as measured using FTIR spectroscopy. The emissivity has a peak of 0.8 around a wavelength of 4.3 micrometers. At this wavelength, CO2 molecules may be excited to vibrate. Hence the configuration 3 of FIG. 12 may preferably be used in CO2 spectroscopy.

By adapting the layers as well as their individual and cumulated thicknesses in configuration 3, the frequency as well as the width of the emissivity peak may be tuned, in particular to match an absorption frequency of an atom or molecule, e.g. in IR spectroscopy. By means of this adapting, also several peaks in the emissivity spectrum may be generated.

The invention claimed is:

1. Infrared device, comprising
a substrate, and
supported by the substrate:
a configuration for emitting infrared radiation, the configuration comprising an electrically conducting layer arrangement of a thickness of 50 nm or less arranged between dielectric layers,
a heater arranged for heating the configuration to emit the infrared radiation.

2. The infrared device of claim 1, comprising
a recess in the substrate,
a membrane spanning at least a portion of the recess,
wherein the configuration is arranged on or in the membrane, or wherein the membrane represents the configuration, and
wherein the heater is arranged on or in the membrane.

3. The infrared device of claim 1,
wherein the electrically conducting layer arrangement is a layer arrangement available in a CMOS layer stack, arranged on the substrate,
wherein, in a vertical direction towards the substrate, the dielectric layer underneath the electrically conducting layer arrangement is an inter metal dielectric of the layer stack, and
wherein the electrically conducting layer arrangement is one or more of an adhesion layer for adhering the inter metal dielectric to a metal layer of the layer stack previously removed, and a diffusion barrier for preventing diffusion between the inter metal dielectric and a metal layer previously removed.

4. The infrared device of claim 1,
wherein the electrically conducting layer arrangement comprises or consists of an interstitial compound comprising one of the metals of group VI to VIII.

5. The infrared device of claim 1,
wherein the electrically conducting layer arrangement comprises or consists of a Ti layer and a TiN layer.

6. The infrared device of claim 5,
wherein the Ti layer has a thickness in the range of 1 to 49 nm,
wherein the TiN layer has a thickness in the range of 1 to 49 nm.

7. The infrared device of claim 1,
wherein the electrically conducting layer arrangement comprises or consists of a Ta layer and a TaN layer.

8. The infrared device of claim 1,
wherein the electrically conducting layer arrangement comprises or consists of a layer of one of Al, Cu, Pt, W.

9. The infrared device of claim 1,
wherein, in a vertical direction away from the substrate, the dielectric layer on top of the electrically conducting layer arrangement comprises or consists of a passivation layer.

10. The infrared device of claim 9,
wherein the passivation layer is a Silicon Nitride layer or a Silicon Oxide layer,
wherein the passivation layer has a thickness between 400 and 800 nm.

11. The infrared device of claim 9,
wherein the dielectric layer on top of the electrically conducting layer arrangement comprises a dielectric tuning layer between the passivation layer and the electrically conducting layer arrangement, for tuning a thickness of the configuration.

12. The infrared device of claim 11,
wherein the dielectric tuning layer is a Silicon Nitride or Silicon Oxide layer.

13. The infrared device of claim 1,
wherein the configuration comprises an electrically conducting layer stack arranged between dielectric layers,
wherein the electrically conducting layer stack has a thickness of more than 100 nm,
wherein the electrically conducting layer stack is arranged between the electrically conducting layer arrangement and a bottom layer of the configuration.

14. The infrared device of claim 9,
wherein the electrically conducting layer arrangement consists of a Ti layer with a thickness of 5 nm and a TiN layer with a thickness of 20 nm, and
wherein the dielectric layer consists of a Silicon Nitride layer with a thickness of 600 nm,
such that an emissivity spectrum of the infrared device has an emissivity peak around 4.3 micrometers.

15. The infrared device of claim 13,
wherein the electrically conducting layer stack comprises or consists of a metal layer (38) arranged between two further electrically conducting layer arrangements.

16. The infrared device of claim 5,
wherein the electrically conducting layer arrangement consists of a Ti layer with a thickness of 5 nm and a TiN layer with a thickness of 20 nm, and
wherein the dielectric layer consists of a Silicon Nitride layer with a thickness of 600 nm,
such that an emissivity spectrum of the infrared device has an emissivity peak around 4.3 micrometers.

17. The infrared device of claim 5,
wherein the electrically conducting layer arrangement consists of a Ti layer with a thickness of 5 nm and a TiN layer with a thickness of 4.2 nm,
wherein the passivation layer consists of a Silicon Oxide layer with a thickness of 1250 nm,
wherein the dielectric tuning layer consists of a Silicon Nitride layer with a thickness of 1500 nm,
such that an emissivity spectrum of the infrared device has an emissivity in. the range of 60% to 100% of a maximum emissivity in the wavelength range between 4 and 10 micrometers.

18. Method for manufacturing an infrared device, comprising
providing a wafer including a substrate and a layer stack, in particular a CMOS layer stack, arranged on the substrate, which layer stack includes at least one metal layer sandwiched between two electrically conducting layer arrangements of less than 50 nm thickness each serving as one or more of an adhesion layer and a diffusion barrier between the metal layer and inter metal dielectrics next to each of the electrically conducting layer arrangements, and including a heater arranged for heating the configuration to emit the infrared radiation,
removing the inter metal dielectric arranged on top of an upper of the electrically conducting layer arrangements as well as the upper electrically conducting layer arrangement,
removing the metal layer, and
depositing a dielectric layer on the lower of the electrically conducting layer arrangements released by the removal of the metal layer.

19. The method of claim 18,
wherein the top inter metal dielectric and the upper electrically conducting layer arrangement are removed in a common etching step, and wherein the metal layer is removed in a separate etching step.

20. The method of claim 18, comprising etching a recess in the substrate for generating a membrane including the configuration including the electrically conducting layer arrangement serving for emitting infrared. radiation.

* * * * *